United States Patent
Thomsen et al.

(10) Patent No.: US 6,617,908 B1
(45) Date of Patent: Sep. 9, 2003

(54) SWITCHED-CAPACITOR CIRCUITS WITH REDUCED DISTORTION

(75) Inventors: Axel Thomsen, Austin, TX (US); Sherry Xiao hong Wu, Austin, TX (US); John Laurence Melanson, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 10/104,125

(22) Filed: Mar. 22, 2002

(51) Int. Cl.[7] .................................................. G06F 7/64
(52) U.S. Cl. ....................................................... 327/337
(58) Field of Search ................................. 327/317, 337, 327/345, 554, 93, 95–96; 341/143, 172

(56) References Cited

U.S. PATENT DOCUMENTS

| | | | | |
|---|---|---|---|---|
| 5,729,232 A | * | 3/1998 | Fujimori | 341/172 |
| 6,031,480 A | * | 2/2000 | Soenen et al. | 341/161 |
| 6,147,522 A | * | 11/2000 | Rhode et al. | 327/93 |
| 6,201,835 B1 | * | 3/2001 | Wang | 375/247 |
| 6,249,240 B1 | * | 6/2001 | Bellaouar | 341/172 |
| 6,445,331 B1 | * | 9/2002 | Stegers | 341/172 |

* cited by examiner

Primary Examiner—My-Trang Nu Ton
(74) Attorney, Agent, or Firm—James J. Murphy, Esq.; Winstead, Sechrest & Minick, P.C.

(57) ABSTRACT

A switched capacitor circuit 300, including a sampling capacitor 303, switches 301, 304 for charging the sampling capacitor 303 during a charging phase, and switches 302, 305 for transferring charge from the sampling capacitor 303 to a load 313 in the feedback loop of an operational amplifier 312 during a dump phase. Circuitry 701 controls the discharge of sampling capacitor 303 during the dump phase to minimize transients at the input of the operational amplifier 312 and thereby minimize input threshold voltage variation.

21 Claims, 5 Drawing Sheets

US 6,617,908 B1

SWITCHED-CAPACITOR CIRCUITS WITH REDUCED DISTORTION

BACKGROUND OF THE INVENTION

1. Field of the Invention

The present invention relates in general to switched-capacitor techniques and in particular to switched-capacitor circuits with reduced distortion in the transfer function.

2. Description of the Related Art

Delta-sigma modulators are particularly useful in digital to analog and analog to digital converters (DACs and ADCs). Using oversampling, the delta-sigma modulator spreads the quantization noise power across the oversampling frequency band, which is typically much greater than the input signal bandwidth. Additionally; the delta sigma modulator-performs noise shaping by acting as a lowpass filter to the input signal and a highpass filter to the noise; most of the quantization noise power is thereby shifted out of the signal band.

The typical delta sigma modulator includes a summer summing the input signal with negative feedback, a linear filter, quantizer and a feedback loop with a digital to analog converter coupling the quantizer output and the inverting input of the summer. In a first order modulator, the linear filter comprises a single integrator stage while the filter in higher a order modulator comprises a cascade of a corresponding number of integrator stages. The quantizer can be either a one-bit or a multiple-bit quantizer. Higher-order modulators have improved quantization noise transfer characteristics over those of lower order, although stability becomes a more critical design factor as the order increases.

Switched-capacitor filters/integrators are useful in a number of applications, including the integrator stages in delta sigma modulators. Generally, in a basic singled-ended switched-capacitor integrator, the input signal is sampled by switches onto a sampling capacitor during the sampling (charging) phase. A reference voltage may also be sampled onto a reference sampling capacitor during this phase. During the following dump phase, the charge on the sampling capacitor(s) is transferred at the summing node of a operational amplifier to the integrator capacitor in the amplifier feedback loop. The operational amplifier drives the integrator output.

During the dump phase, transients of up to a few volts can occur at the summing nodes. These relatively high voltages can cause the threshold voltage of the MOSFETs at the operational amplifier inputs to temporarily vary from the expected nominal threshold voltages. Consequently, an offset is introduced at the inputs of the operational amplifier which can in turn cause distortion in the circuit transfer function. In high performance applications, this distortion may not be acceptable. Hence, techniques are required for minimizing summing node transients in switched capacitor circuits, especially those switched capacitor circuits used in high performance applications where minimization of distortion is desirable.

SUMMARY OF THE INVENTION

The principles of the present invention address the problem of variation in the input threshold voltage of an operational amplifier and in particular, operational amplifiers used in switched capacitor circuits.

According to one embodiment of these principles, a switched-capacitor circuit is disclosed includes a sampling capacitor, switches for charging the sampling capacitor during a charging phase, and switches for transferring charge from the sampling capacitor to a load in a feedback loop of an operational amplifier during a dump phase. Circuitry is provided for controlling discharge of the sampling capacitor during the dump phase to minimize transients at the input of the operational amplifier and thereby minimize input threshold voltage variation.

Thus, according to the inventive principles, the input transients at the operational amplifier inputs are substantially reduced and consequently input threshold voltage variation is also reduced. Ultimately, the reduction in input threshold voltage variation reduces distortion in the amplifier output.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

The principles of the present invention and their advantages are best understood by referring to the illustrated embodiment depicted in FIGS. 1–7 of the drawings, in which like numbers designate like parts.

Figure 1:
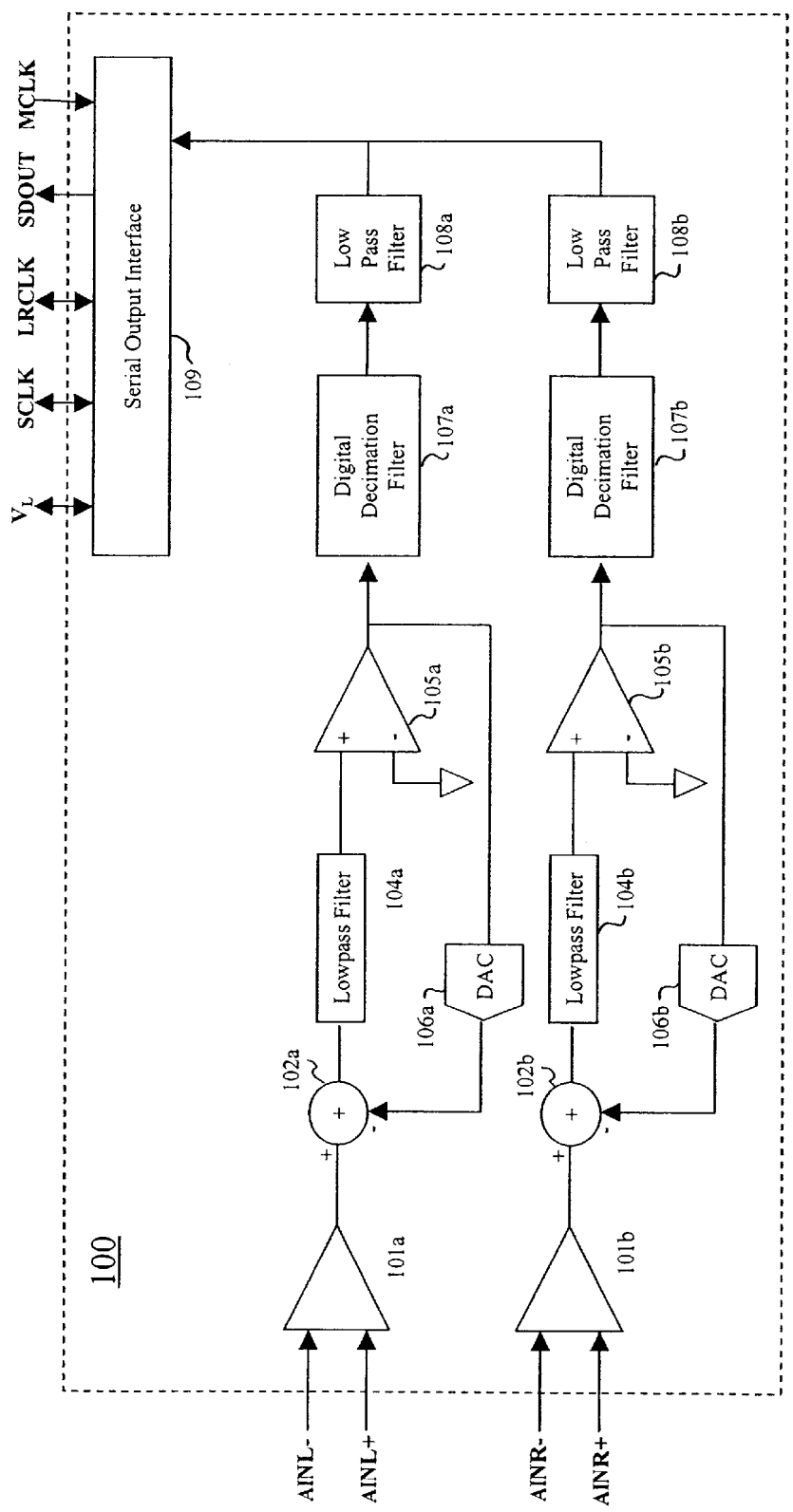
FIG. 1 is a high level functional block diagram of an analog to digital converter suitable for illustrating the application of the inventive principles.

FIG. 1 is a high level functional block diagram of a single-chip audio analog-to-digital (A/D) 100 suitable for practicing the principles of the present invention. A/D converter 100 is only one of a number of possible applications employing delta-sigma modulators. Other examples include digital to analog converters (DACs) and Codecs.

A/D converter 100 includes two conversion paths for converting left and right channel analog audio data respectively received at left and right analog differential inputs AINL+/− and AINR+/−. The analog inputs are each passed through an input gain stage 101 and then to a 5th order delta-sigma modulator.

Each delta-sigma modulator is represented in FIG. 1 by a summer 102, low-pass filter 104, comparator (quantizer) 105 and DAC 106 in the feedback loop. The outputs from the delta-sigma modulators are passed through a decimation filter 107, which reduces the sample rate, and a low pass filter 108. The delta sigma modulators sample the analog signal at the oversampling rate and output digital data in either single-bit or multiple-bit form, depending on the quantization, at the oversampling rate. The resulting quantization noise is shaped and generally shifted to frequencies above the audio band.

The resulting left and right channel digital audio data are output through a single serial port SDOUT of serial output interface 109, timed with serial clock SCLK and left-right clock LRCLK in accordance with the Digital Interface Format (DIF). The SCLK and LRCLK clocks can be generated externally and input to converter 100 or can be generated on-chip, along with the associated data, in response to a received master clock MCLK.

Figure 2:
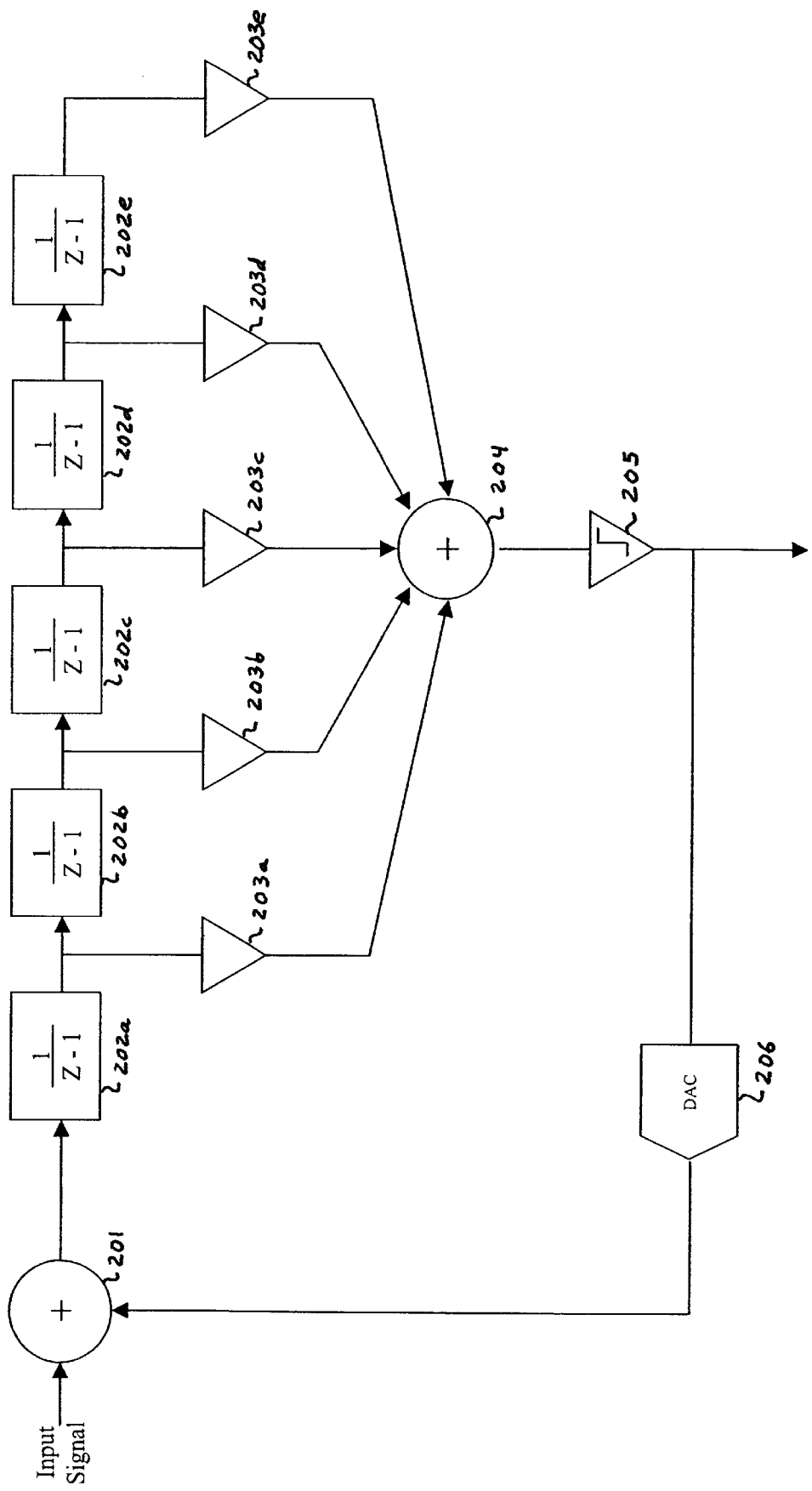
FIG. 2 is a functional block diagram of an exemplary $5^{th}$ order delta-sigma modulator suitable for use in circuits and systems such as the analog to digital converter shown in FIG. 1.

FIG. 2 is an exemplary 5th order delta-sigma modulator 200 comprising an input summer 201 and 5 integrator stages 202a,e. Delta sigma modulator 200 is of a weighted feed-forward design in which the outputs of each of the integrator stages are passed through a gain stage (amplifier) 203a,e to summer 205. Amplifiers 203a,e allows the outputs of the integrator stages to be weighted at the summer 204 input. The output from summer 204 is quantized by a multiple-bit.quantizer 205 which provides the multiple-bit digital output signal. Additionally, the output from quantizer 205 is feedback to the inverting input of summer 201 through digital to analog converter 207. (A 5th order feed-forward design was selected for describing the application of the inventive concepts; in actual implementations the order as well as the configuration of the modulator will vary.)

Figure 3:
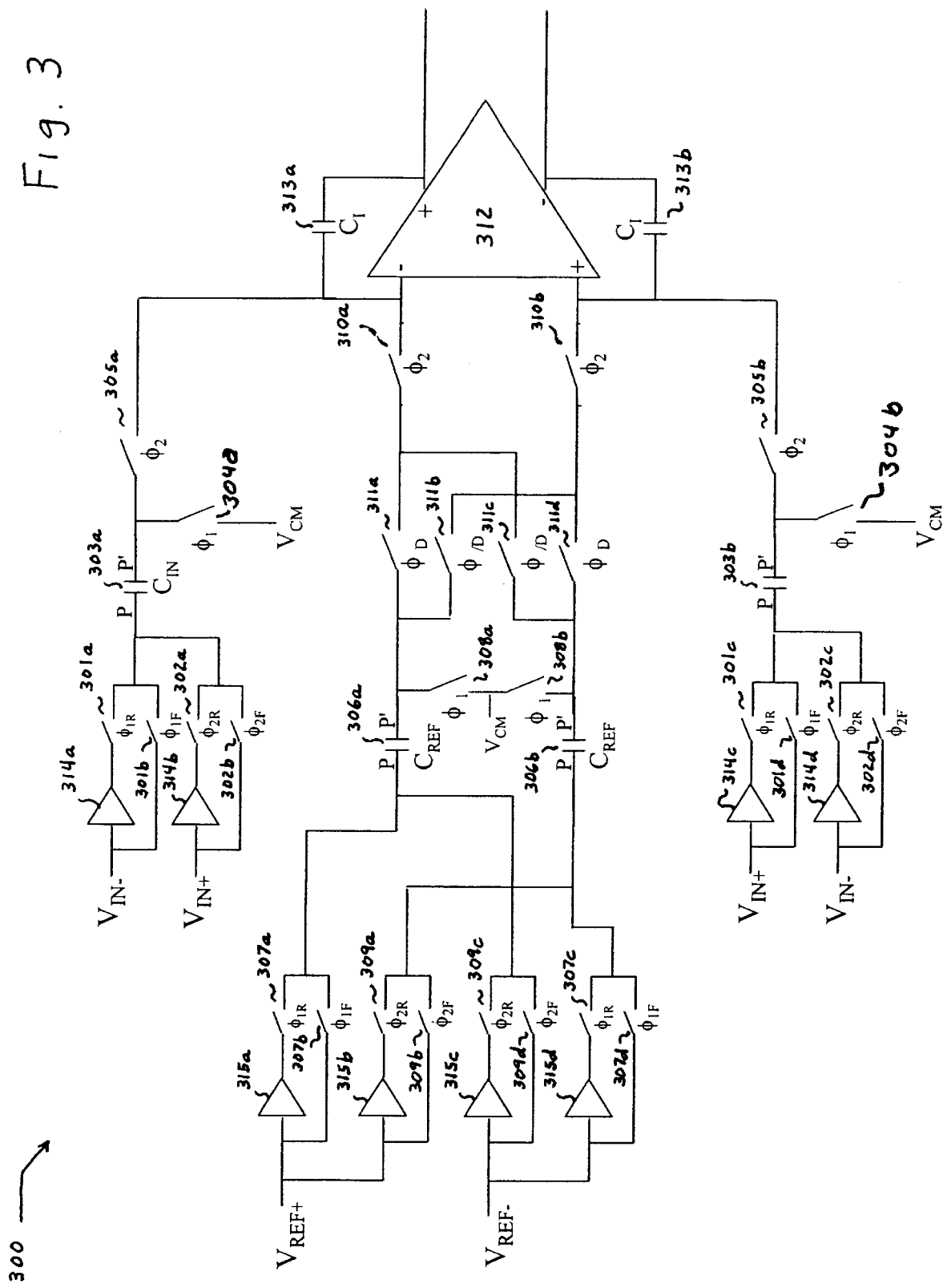
FIG. 3 is an electrical schematic diagram of a switched capacitor integrator embodying the inventive principles.

FIG. 3 is an electrical schematic diagram of a typical switched capacitor integrator 300 suitable for the first stage of delta sigma modulator 200. Generally, the first integrator stage of a delta- sigma modulator is the most critical to setting the distortion performance and therefore will be the focus of the following discussion. It should be noted however that the concepts discussed below are useful in a number of switched capacitor applications, including various delayed and undelayed switched capacitor integrators.

Figure 4:
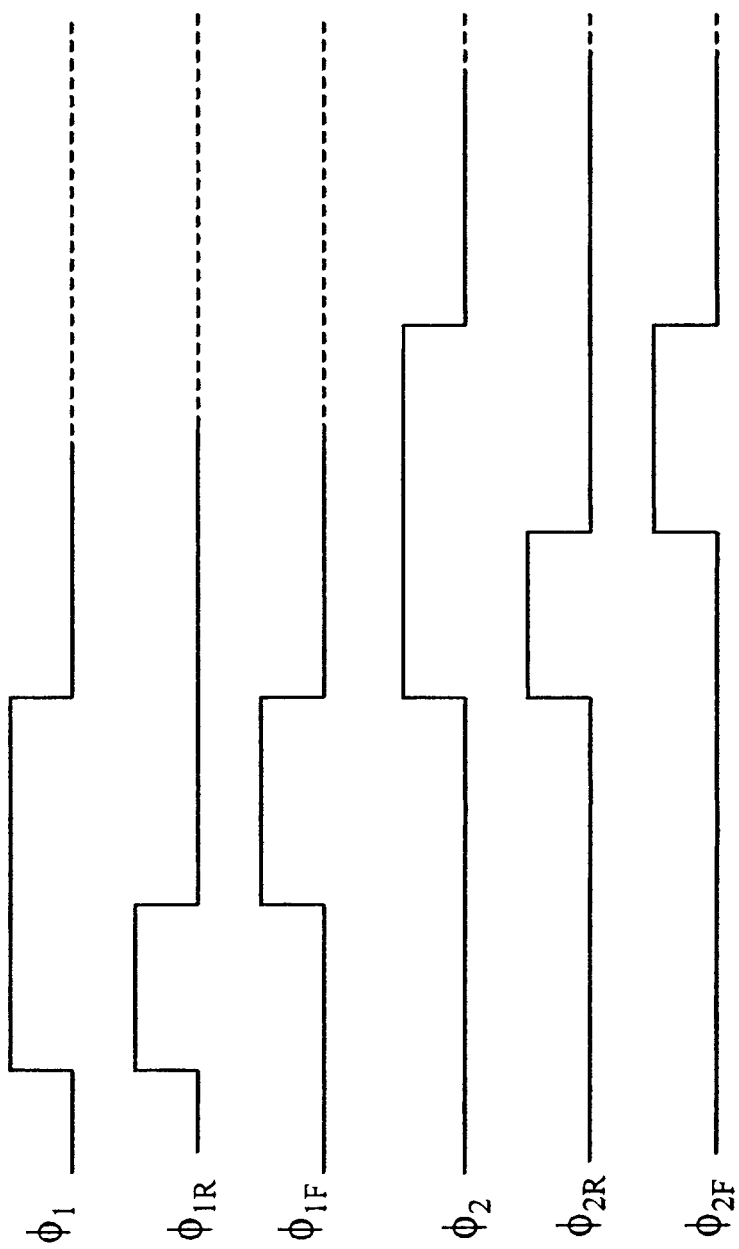
FIG. 4 is a timing diagram illustrating the relationship between the control signals shown in FIG. 3.

Switched capacitor integrator 300 operates in two non-overlapping phases $\phi_1$ and $\phi_2$ per sample. This timing is shown in FIG. 4. As will be discussed further, in the preferred embodiment each phase is composed of rough and fine subphases ($\phi_{1R}$, $\phi_{1F}$, $\phi_{2R}$, $\phi_{2F}$). In the general case, during Phase 1 ($\phi_1$) switches 301a–d and 304a,b close and the differential input voltage $V_{IN}$ is sampled onto input sampling capacitors ($C_{IN}$) 303a,b. Switches 302a,d and 305a,b are open during $\phi_1$.

Also during $\phi_1$, the differential reference signal $V^{REF}$ on to reference sampling capacitors ($C_{REF}$) 306a,b by switches 307a,d and 308a,b. Switches 309a,d and 310a,b are open during Phase 1. Switches 311a,d under the control of the complementary bits D and /D from the 1-bit data output from the quantizer couple or cross-couple reference sampling capacitors $C_{REF}$ 306a,b to the inverting and non-inverting summing inputs to op amp 312.

During Phase 2 ($\phi_2$) the switches reverse their configuration with switches 302a,d and 305a,b closing and switches 301a,d and 304a,b opening for the input path. For the reference path, switches 307a,d and 308a,b open and switches 309a,d and 310a,b close. Consequently, the charge on input and reference sampling capacitors $C_{IN}$ and $C_{REF}$ is transferred to the inverting (−) and non-inverting (+) inputs of opamp 312 (the summing nodes) and integrator capacitors ($C_1$) 313a,b.

As previously noted, in the preferred integrator 300 operates in rough and fine subphases. During the rough subphase of Phase 1 ($\phi_{1R}$), the input plates P of sampling capacitors $C_{IN}$ and $C_{REF}$ are driven by rough buffers 314a,c and 315a,d which provide an increased charging current. Subsequently, these plates are brought to their full sampling voltage during the Phase 1 fine subphase ($\phi_{1F}$) by direct coupling to the corresponding input or reference voltage. More importantly, during phase 2 charge dumping, rough buffers 314 and 315 provide increased drive during the rough subphase ($\phi_{2R}$) to rapidly slew the voltage on capacitor input plates P towards the opposite voltage to transfer the sampled charge to plates P' and integration capacitors $C_{IN}$. The charge transfer is completed during the Phase 2 fine subphase ($\phi_{2F}$) by direct coupling of capacitor input plates P to the appropriate input.

Without special efforts, large transients can develop at the summing nodes during Phase 2. Specifically, during the initial charge dump, the inputs of the opamp will attempt to follow different voltages, depending on the complementary charges on sampling capacitors $C_{IN}$ and $C_{REF}$. These voltages can be on the order of a few volts depending on the values of $V_{REF}$+/− and $V_{IN}$+/. Relatively large voltages such as these can cause a temporary variation in the threshold voltage ($V_t$) of the MOSFETs at the opamp inputs. Specifically, the $V_t$ of a given MOSFET subjected to a relatively high gate to source voltage ($V_{gs}$) may develop a "memory" and accordingly vary. This variation in $V_t$ effectively acts as a signal dependent offset between the differential inputs of the opamp to which the opamp settles at the end of the dump stage. Consequently, a signal dependant residual charge remains on capacitors $C_{IN}$ and $C_{REF}$, resulting in distortion at the integrator output.

The present inventive concepts advantageously address this problem by reducing the voltage transients appearing at the opamp summing nodes to a few hundred millivolts or less.

Figure 5:
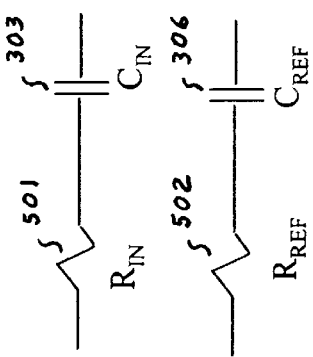
FIG. 5 is an electrical schematic diagram of first sampling capacitor discharge control circuitry according to the inventive principles.
Figure 7:
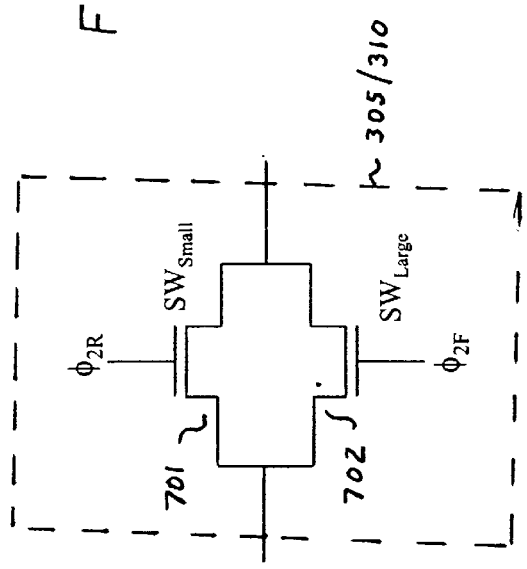
FIG. 7 is an electrical schematic diagram of third sampling capacitor discharge control circuitry according to the inventive principles.

According to a first embodiment, a resistor $R_{IN}$ (501) is inserted in series with each input sampling capacitor $C_{IN}$ and/or a resistor $R_{REF}$ (502) is provided in series with each reference voltage sampling capacitor $C_{REF}$. This is illustrated in FIG. 5. The resistors in the reference voltage paths are particularly advantageous since the reference sampling capacitors $C_{REF}$ normally provide a larger charge dump. Resistors $R_{IN}$ and $R_{REF}$ lengthen the time constant of the capacitor discharge phase and limit the current such that the discharge does not exceed the slew rate of the opamp. Although these resistors are shown in front of the capacitors in FIG. 5, they may also follow the capacitors without deviating from the basic principles of the invention.

Figure 6:
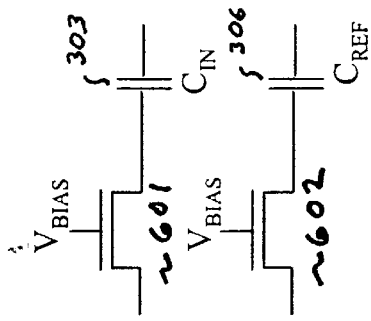
FIG. 6 is an electrical schematic diagram of second sampling capacitor discharge control circuitry according to the inventive principles.

This can also be done by replacing resistors with current limiting devices such as MOSFETs 601 and 602 biased in saturation, as shown in FIG. 6. The current in this case is maintained below the slew capability of opamp 312 such that the opamp will remain in the small signal settling mode.

FIG. 7A illustrates a further embodiment in which the switches 305a,b and/or switches 310a,b are replaced by a pass-gate formed by a pair of switches (transistors) 701 and 702. Here, switch 701 is smaller and has a higher impedance than switch 702 which is larger and has a lower impedance. During the Phase 2, switches 701 and 702 are alternatively turned-on the rough ($\phi_{2R}$) and fine sub-phases ($\phi_{2F}$). Specifically, during the rough dump phase ($100_{2R}$), smaller, higher impedance switch 701 is used to discharge the associated sampling capacitors to the summing nodes with a longer time constant to allow the opamp to settle. During the subsequent fine phase, larger, lower impedance resistor 702 is used to complete the charge transfer. (As an alternative, switches 701 and 702 can be made of equal size and a resistance added in series with switch 701 to achieve the same effect).

In a further application of the inventive concepts, rough buffers 314 are designed such that the drive sampling capacitors $C_{IN}$ and $C_{REF}$ at a slew rate less than the slew rate of the opamp. In other words:

$$S_{IN} + S_{REF} \leq S_{AMP}$$

where in $S_{IN}$ is the maximum slew rate $(dV/dt)_{Max}$ of the rough buffer of one differential input signal path, $S_{REF}$ is the maximum slew rate $(dV/dt)_{Max}$ of the rough buffer of one differential reference signal path and $S_{AMP}$ is the maximum slew rate of the opamp $(dV/dt)_{Max}$. Under these constraints, the summing node voltages at the inputs to the opamp to not transition faster than the opamp can settle them. Consequently, spikes and similar transients are substantially reduced or eliminated such that the threshold voltages of the opamp input transistors do not vary significantly.

In sum, the present concepts address the problem of distortion caused by transient-induced offsets at the input of the opamp. Specifically, by substantially reducing or eliminating transients at the summing nodes during the charge dump phase, variation in the threshold voltages of the opamp input transistors is controlled. In turn, voltage offset between the opamp inputs are minimized which reduces the output distortion caused by residual charge on the integration capacitors.

Although the present invention and its advantages have been described in detail, it should be understood that various changes, substitutions and alterations can be made herein without departing from the spirit and scope of the invention as defined by the appended claims.

What is claimed is:

1. A switched capacitor circuit including a sampling capacitor, switches for charging the sampling capacitor during a charging phase and switches for transferring charge from the sampling capacitor to a load in a feedback loop of an operational amplifier during a dump phase comprising:
    circuitry for slowing discharge of said sampling capacitor during said dump phase by increasing a time constant associated with the sampling capacitor to minimize transients at said input of said operational amplifier.

2. The switched capacitor circuit of claim 1 wherein said circuitry for slowing discharge of said sampling capacitor comprises a resistor disposed in series with said sampling capacitor.

3. The switched capacitor circuit of claim 1 wherein said circuitry for slowing discharge of said sampling capacitor comprises a current limiting device in series with said sampling capacitor.

4. The switched capacitor circuit of claim 1 wherein said circuitry for slowing discharge of said sampling capacitor comprises a first transistor with a first higher impedance for coupling said sampling capacitor and said input of said amplifier during a first subphase of said dump phase and a second transistor with a second lower impedance for coupling said sampling capacitor and said input of said amplifier during a second subphase of said dump phase.

5. The switched capacitor circuit of claim 1 wherein said circuitry for slowing discharge comprises a buffer for changing a voltage on an input plate of said sampling capacitor during said dump phase at a slew rate less than a slew rate of said amplifier.

6. The switched capacitor circuit of claim 1 wherein load in said feedback loop of said operational amplifier comprises an integration capacitor.

7. The switched capacitor circuit of claim 1 wherein said sampling capacitor samples an input signal.

8. The switched capacitor circuit of claim 1 wherein said sampling capacitor samples a reference signal.

9. A switched capacitor integrator, comprising:
    first switches for sampling at least one signal onto at least one sampling capacitor during a first operational phase;
    an operational amplifier including an input summing node;
    an integration capacitor coupling an output of the operational amplifier and the input summing node;
    second switches for transferring charge sampled onto the at least one sampling capacitor to the integration capacitor node during a second operational phase; and
    circuitry for reducing a continuous rate of charge transfer between the at least one sampling capacitor and the integration capacitor such that the rate of change of an output of the operational amplifier is less than a slew rate limit of the operational amplifier.

10. The switched capacitor integrator of claim 9 wherein said first switches comprise a first input switch charging the input sampling capacitor through a rough buffer during a rough charge subphase and a second switch for charging the input sampling capacitor directly from an input during a fine subphase of the first phase.

11. The switched capacitor integrator of claim 10 wherein the rough buffer has a slew rate less than the slew rate of the operational amplifier.

12. The switched capacitor integrator of claim 9 wherein said second switches comprise a first input switch charging the reference sampling capacitor through a rough buffer during a rough charge subphase and a second switch for charging the reference sampling capacitor directly from an input during a fine subphase of the first phase.

13. The switched capacitor integrator of claim 12 wherein the rough buffer has a slew rate less than the slew rate of the operational amplifier.

14. The switched capacitor integrator of claim 9 wherein the circuitry for reducing the rate of change comprises a current limiting device in series with at least one of the input and reference sampling capacitors.

15. The switched capacitor integrator of claim 9 wherein the third switches comprise a first switch for coupling the input sampling capacitor with the integration capacitor with a higher impedance during a rough subphase of the second phase and a second switch for coupling the input sampling capacitor with the integration capacitor through a lower impedance during a fine subphase of the second phase.

16. The switched capacitor integrator of claim 9 wherein the fourth switches comprise a first switch for coupling the reference sampling capacitor with the integration capacitor with a higher impedance during a rough subphase of the second phase and a second switch for coupling the reference sampling capacitor with the integration capacitor through a lower impedance during a fine subphase of the second phase.

17. The switched capacitor integrator of claim 9 wherein said switched capacitor integrator forms a portion of a delta sigma modulator.

18. A method for reducing distortion caused by variations in a threshold voltage of input transistors at an input of an operational amplifier in a switched capacitor circuit including a sampling capacitor, switches for charging the sampling capacitor during a charging phase, and switches for transferring charge from the sampling capacitor to an integration capacitor in a feedback loop of the operational amplifier during a dump phase comprising the step of:
    slowing discharge of the sampling capacitor during the dump phase to minimize transients at the inputs of the input transistors at the input of the operational amplifier by increasing a time constant associated with the sampling capacitor.

19. The method of claim 18 wherein said step of slowing comprises the step of limiting a current between the sampling capacitor and the input of the operational amplifier.

20. The method of claim 18 wherein said step of slowing comprises the step of limiting a slew rate of the discharge of the sampling capacitor during the dump phase to be less than a slew rate of the operational amplifier.

21. A switched capacitor integrator comprising:

first switches for sampling at least one signal onto at least one sampling capacitor during a first operational phase;

a operational amplifier including an input summing node;

an integration capacitor coupling an output of the operational amplifier and the input summing node;

second switches for transferring charge sampled onto the at least one sampling capacitor to the integration capacitor node during a second operational phase; and circuitry for reducing a continuous rate of charge transfer between the at least one sampling capacitor and the integration capacitor such that an input of the operational amplifier is maintained in a linear operating range.

* * * * *